(12) United States Patent
Wu

(10) Patent No.: US 8,294,678 B2
(45) Date of Patent: Oct. 23, 2012

(54) IMAGE DISPLAY SYSTEMS

(75) Inventor: Tse-Hung Wu, Yonghe (TW)

(73) Assignee: Chimei Innolux Corporation, Chu-Nan (TW)

( * ) Notice: Subject to any disclaimer, the term of this patent is extended or adjusted under 35 U.S.C. 154(b) by 827 days.

(21) Appl. No.: 12/380,899

(22) Filed: Mar. 4, 2009

(65) Prior Publication Data

US 2009/0231294 A1  Sep. 17, 2009

(30) Foreign Application Priority Data

Mar. 12, 2008 (TW) ............................... 97108676 A

(51) Int. Cl.
*G06F 3/041* (2006.01)
*G09G 5/00* (2006.01)

(52) U.S. Cl. ..................................... 345/173; 345/156

(58) Field of Classification Search .......... 345/156–184, 345/104; 178/18.01–20.04; 200/600
See application file for complete search history.

(56) References Cited

U.S. PATENT DOCUMENTS

| | | | |
|---|---|---|---|
| 6,075,520 A * | 6/2000 | Inoue et al. ................... | 345/173 |
| 6,239,788 B1 * | 5/2001 | Nohno et al. .................. | 345/173 |
| 7,280,167 B2 * | 10/2007 | Choi et al. ..................... | 349/12 |
| 7,432,915 B2 * | 10/2008 | Yoshikawa .................... | 345/173 |
| 2005/0094038 A1 * | 5/2005 | Choi et al. ..................... | 349/12 |
| 2007/0030255 A1 * | 2/2007 | Pak et al. ...................... | 345/173 |
| 2007/0257890 A1 * | 11/2007 | Hotelling et al. ............. | 345/173 |
| 2009/0091552 A1 * | 4/2009 | Lee ................................ | 345/174 |
| 2009/0160822 A1 * | 6/2009 | Eguchi et al. ................. | 345/174 |
| 2010/0013779 A1 * | 1/2010 | Wu ................................ | 345/173 |

* cited by examiner

*Primary Examiner* — Alexander Eisen
*Assistant Examiner* — Patrick F Marinelli
(74) *Attorney, Agent, or Firm* — Liu & Liu

(57) ABSTRACT

Image display systems are provided, in which a touch sensing circuit includes at least one voltage storing unit to generate a corresponding voltage when a capacitance variation caused by a touch event occurs. The voltage storing unit includes a first capacitor having a first terminal coupled to an alternating current (AC) common voltage from a common electrode and a second terminal coupled to a first node, a first switching element having a first terminal coupled to the second terminal of the first capacitor and a second terminal coupled to the AC common voltage, and a second switching element having a first terminal coupled to the second terminal of the first capacitor.

16 Claims, 6 Drawing Sheets

IMAGE DISPLAY SYSTEMS

CROSS REFERENCE TO RELATED APPLICATIONS

This Application also claims priority of Taiwan Patent Application No. 097108676, filed on Mar. 12, 2008, the entirety of which is incorporated by reference herein.

BACKGROUND OF THE INVENTION

1. Field of the Invention

The invention relates to image display systems, and more particularly, to touch sensing circuits of image display systems.

2. Description of the Related Art

Recently, owing to emergence of information appliance (IA) products, touch panels have gradually replaced traditional human-machine interfaces, such as keyboards and mice. As users can operate the touch panel easily and conveniently, the application of touch panels has expanded to various fields, such as portable communication products and information products (e.g., PDA), banking/business systems, medical registry systems, factory-monitoring systems, public information-guide systems, and computer-based instruction systems. As for sensing methods, touch panels may be divided into capacitive types, sonic types, infrared types, resistive types, and magnetic induction types. Among the sensing method types, the capacitive types are applied to large-size touch panels. The contact of a finger or a pen point on a capacitive touch panel will create a capacitive change, which will further induce a current. Meanwhile, the X-coordinate and the Y-coordinate of the contact point can be calculated according to the induced current. Then, instructions or functions corresponding to the contract point may be transmitted.

BRIEF SUMMARY OF THE INVENTION

Embodiments of an image display system are provided, in which a touch sensing circuit comprises at least one voltage storing unit to generate a corresponding voltage when a capacitance variation caused by a touch event occurs. The voltage storing unit comprises a first capacitor having a first terminal coupled to an alternating current (AC) common voltage from a common electrode and a second terminal coupled to a first node. Also, a first switching element has a first terminal coupled to the second terminal of the first capacitor and a second terminal coupled to the AC common voltage, and a second switching element has a first terminal coupled to the second terminal of the first capacitor.

The invention also provides an embodiment of an image display system, in which a touch sensing circuit comprises first and second voltage storing units each generating a corresponding voltage when a capacitance variation caused by a touch event occurs. Additionally, an integration unit integrates the corresponding voltage generated by the first voltage storing unit to generate a first output signal during a first period, and integrates the corresponding voltage generated by the second voltage storing unit to generate a second output signal during a second period. The first and second voltage storing units each comprises a first capacitor having a first terminal coupled to an alternating current (AC) common voltage from a common electrode, and a second terminal coupled to a first node. Also, a first switching element has a first terminal coupled to the second terminal of the first capacitor and a second terminal coupled to the AC common voltage, and a second switching element has a first terminal coupled to the second terminal of the first capacitor.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Certain terms are used throughout the description and claims to refer to particular system components. As one skilled in the art will appreciate, consumer electronic equipment manufacturers may refer to a component by different names. This document does not intend to distinguish between components that differ in name but not function.

Figure 1:
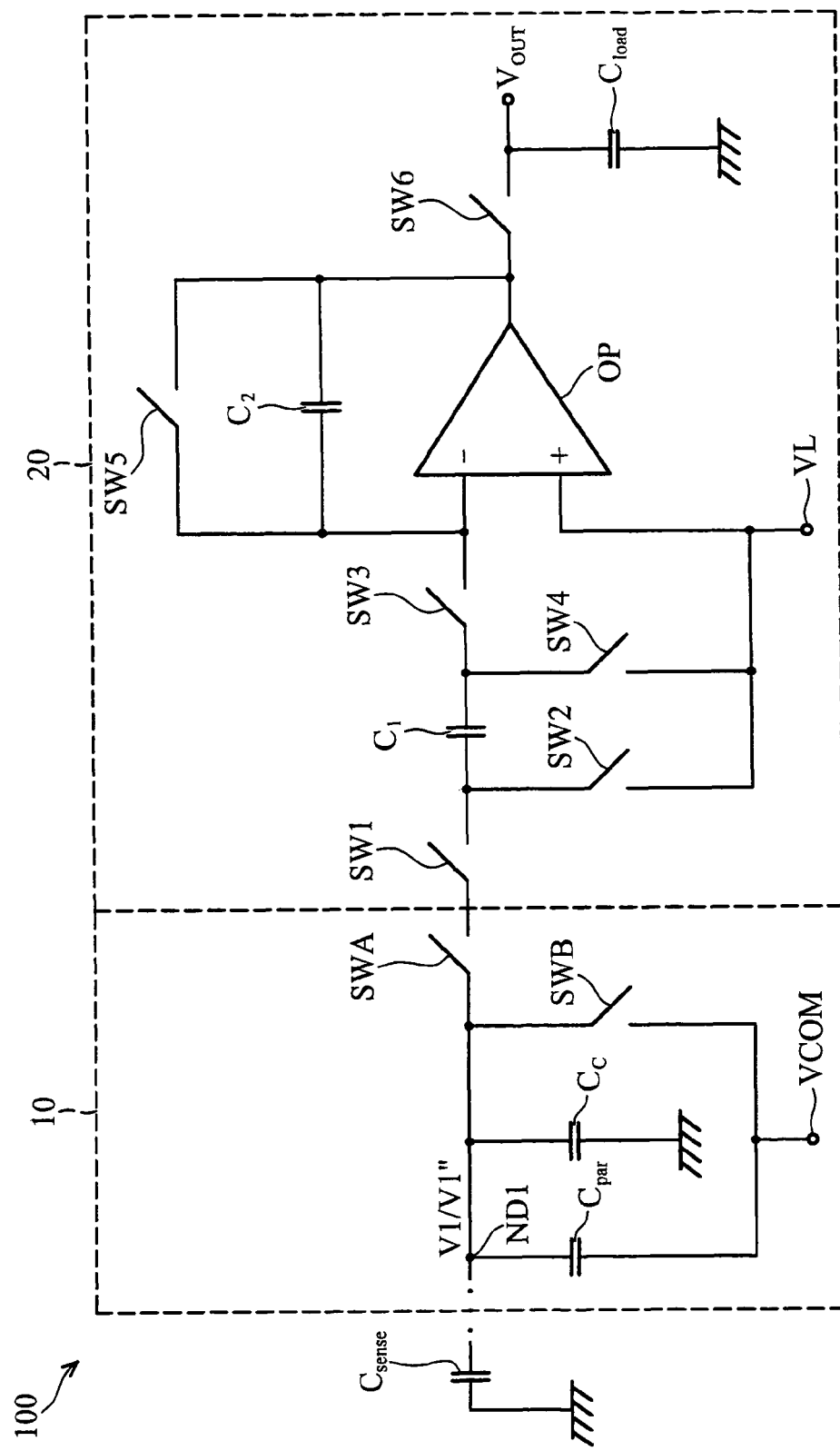
FIG. 1 shows an embodiment of a touch sensing circuit according to the invention.

FIG. 1 shows an embodiment of a touch sensing circuit according to the invention. As shown, the touch sensing circuit 100 is adapted to a capacitive sensing touch panel, and the touch sensing circuit 100 comprises at least one voltage storing unit 10 and an integration unit 20. The voltage storing unit 10 generates a corresponding voltage when a capacitance variation caused by a touch event occurs, and the integration unit integrates the corresponding voltage generated by the voltage storing unit 10 to generate an output signal for touch processing.

The voltage storing unit 10 comprises capacitors $C_{par}$ and $C_c$ and switching elements SWA and SWB. The capacitor $C_{par}$ has a first terminal coupled to an altering current (AC) common voltage VCOM from a common electrode (not shown) and a second terminal coupled to a node ND1. For example, the capacitor $C_{par}$ is a capacitor formed between a surface of a touch panel and the common electrode, and the AC common voltage VCOM has a relatively high voltage level (not show) and a relatively low voltage level VL. The capacitor $C_c$ has a first terminal coupled to the node ND1 and a second terminal coupled to a ground terminal. For example, the capacitor $C_c$ is a parasitical capacitor between wires of the touch panel and the ground terminal. The switching element SWA is coupled between the node ND1 and the integration unit 20 and the switching element SWB is coupled between the node ND1 and the AC common voltage VCOM. In some embodiments, the relatively high voltage level and the relatively low voltage level of the AC common voltage VCOM can be 5V and 0V, but is not limited thereto.

The integration unit 20 comprises switching elements SW1~SW6, capacitors $C_1$~$C_2$ and $C_{load}$ and an operational amplifier OP. The switching element SW1 has a first terminal coupled to the second terminal of the switching element SWA, and a second terminal coupled to the capacitor $C_1$. The switching element SW2 has a first terminal coupled to the second terminal of the switching element SW1, and a second terminal coupled to the relatively low voltage level VL of the AC common voltage VCOM. The capacitor $C_1$ has a first terminal coupled to the second terminal of the switching element SW1 and the first terminal of the switching element SW2, and a second terminal coupled to the switching elements SW3 and SW4. The switching element SW3 has a first terminal coupled to the second terminal of the capacitor $C_1$ and a second terminal coupled to the operational amplifier OP. The switching element SW4 has a first terminal coupled to the second terminal of the capacitor $C_1$, and a second terminal coupled to the relatively low voltage level VL of the AC common voltage VCOM.

The operational amplifier OP has an inversion input terminal coupled to the second terminal of the switching element SW3, a non-inversion input terminal coupled to the relatively low voltage level VL of the AC common voltage VCOM, and an output terminal coupled to the switching elements SW5 and SW6 and the capacitor $C_2$. The capacitor $C_2$ is coupled between the inversion input terminal and the output terminal of the operational amplifier OP, and the switching element SW5 is coupled between the inversion input terminal and the output terminal of the operational amplifier OP. The switching element SW6 has a first terminal coupled to the output terminal of the operational amplifier OP and a second terminal coupled to the capacitor $C_{load}$, and the capacitor $C_{load}$ is coupled between the second terminal of the switching element SW6 and the ground terminal. For example, the switching elements SWA~SWB and SW1~SW6 are transistors, such as MOS transistors or bipolar junction transistors, but is not limited thereto.

Figure 2:
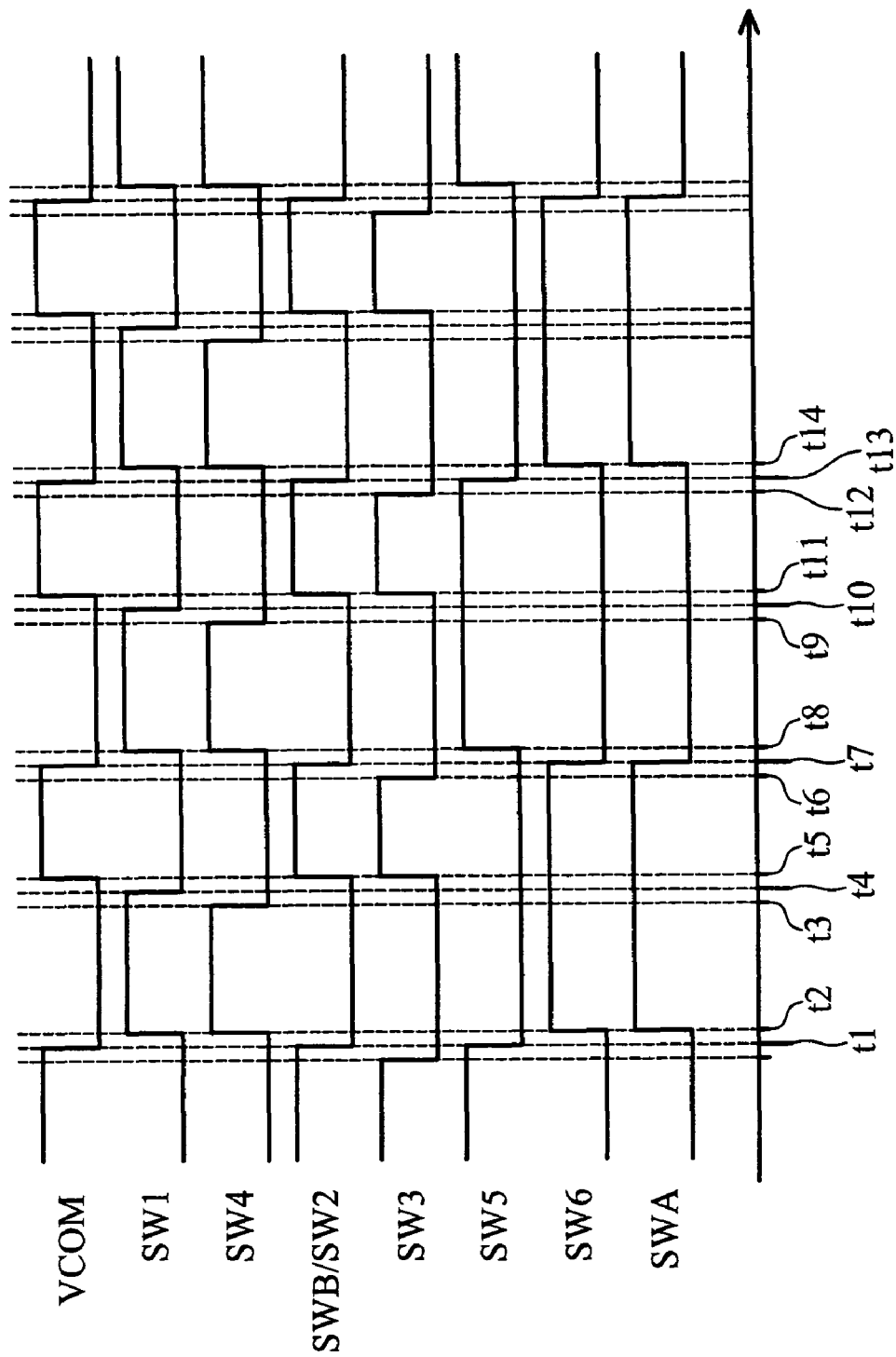
FIG. 2 is a timing chart of the touch sensing circuit shown in FIG. 1.

FIG. 2 is a timing chart of the touch sensing circuit shown in FIG. 1. Operations of the touch sensing circuit are discussed hereafter with reference to FIGS. 1 and 2.

For example, the capacitor $C_{sense}$ represents a finger of a user or a stylus, and capacitance of the capacitor $C_{sense}$ is much smaller than that of the capacitor $C_{par}$. In some embodiments, the ratio of the capacitance of the capacitor $C_{sense}$ to that of the capacitor $C_{par}$ can be 1:1500, but is not limited thereto.

At time t1, the switching element SWB is turned off and the AC common voltage VCOM is changed to the relatively low voltage level (0V) from the relatively high voltage level (5V), and the voltage V1 at the node ND1 varies according to whether the capacitor $C_{sense}$ is coupled to the node ND1.

For example, when the capacitor $C_{sense}$ is not coupled to the node ND1 (i.e. the finger of the user or the stylus does not contact with the touch panel), the voltage variation at the node ND1 can be represented as $$\Delta V \times \left(\frac{C_{par}}{C_{par} + C_c}\right).$$

Because the capacitance of the capacitor $C_c$ can be designed to be much smaller than that of the capacitor $C_{par}$, the voltage V1 at the node ND1 is decreased to near 0V from the previously stored voltage level (5V).

On the contrary, when the capacitor $C_{sense}$ is coupled to the node ND1 (i.e, the finger of the user or stylus contacts with the touch panel), the voltage variation at the node ND1 can be represented as $$\Delta V \times \left(\frac{C_{par}}{C_{par} + C_c + C_{sense}}\right).$$

Because the capacitance of the capacitor $C_{sense}$ is much smaller than that of the capacitor $C_{par}$, voltage variation at the node ND1 at this time is slightly smaller than that when the capacitor $C_{sense}$ is not coupled to the node ND1. Hence, the voltage V1" at the node ND1 would be decreased to about 0.003V from the previously stored voltage level (5V), but is not limited thereto. In addition, the voltage V1" is stored in the capacitors $C_{sense}$, $C_c$ and $C_{par}$. Namely, the voltage V1" of about 0.003V is generated at the node ND1 when a touch event occurs, and the voltage V1 of about 0V is generated at the node ND1 when the touch event does not occur.

At time t2, the switching element SWA is turned on, and thus, the voltage V1 or V1" at the node ND1 in the voltage storing unit 10 is output to the integration unit 10. Meanwhile, the voltage V1 or V1" is also stored in the capacitor $C_1$ because the switching elements SW1, SW4 and SW6 are turned on.

At time t3, the switching element SW4 is turned off. At time t4, the switching element SW1 is then turned off. At time t5, the switching elements SW2 and SW3 are turned on such that the voltage V1 or V1" stored in the capacitor $C_1$ is integrated by an integrator composed of the operational amplifier OP and capacitors $C_1$ and $C_2$ to serve as an output signal output to the capacitor $C_{load}$. For example, the integrated voltage (i.e., the output signal $V_{OUT}$) can be represented as $$V1 \times \frac{C_1}{C_2} \text{ or } V1'' \times \frac{C_1}{C_2}.$$

It should be noted that the voltage V1 is almost 0V when the capacitor $C_{sense}$ is not coupled to the node ND1, and thus, the integrated voltage is still maintained at 0V. Meanwhile, the switching element SWB is turned on again, and the AC common voltage VCOM is changed to the relatively high voltage level from the relatively low voltage level VL. Hence, the node ND1 is accordingly charged to the relatively high voltage level.

At time t6, the switching element SW3 is turned off. At time t7, the switching elements SWA, SWB and SW2 are turned off and the AC common voltage VCOM is changed to the relatively low voltage level VL from the relatively high voltage level. Meanwhile, the switching element SW6 is turned off. In addition, the voltage at the node ND1 varies again according to whether the capacitor $C_{sense}$ is coupled to the node ND1. The voltage variation at the node ND1 at time t6 is similar to that discussed at time t2 and thus is omitted for briefly.

At time t8, the switching element SW5 is turned on. The voltage stored in the capacitor $C_2$ is discharged by a virtual short between the inversion input terminal and the non-inversion input terminal of the operational amplifier OP. Meanwhile, the switching element SW4 is turned on to couple one terminal of the capacitor $C_1$ to the relatively low voltage level VL. In addition, the switching element SW1 is turned on. At time t9, the switching element SW4 is turned off. At time t10, the switching element SW1 is turned off.

At time t11, the switching element SW2 and SW3 are turned on, such that two ends of the capacitor $C_1$ are both coupled to the relatively low voltage level VL, thereby discharging the capacitor $C_1$. At this time, the capacitors $C_1$ and $C_2$ are both discharged. Meanwhile, the switching element SWB is turned on, and the AC common voltage VCOM is changed to the relatively high voltage level from the relatively low voltage level VL, such that the node ND1 is charged to the relatively high voltage level. At time t12, the switching elements SW3 is turned off. At time t13, the switching elements SW2 and SW5 are both turned off to end charging. In addition, the switching element SWB is turned off and the AC common voltage VCOM is changed to the relatively low voltage level VL from the relatively high voltage level. Hence, the voltage at the node ND1 varies again according to whether the capacitor $C_{sense}$ is coupled to the node ND1.

At time t14, the switching element SWA is turned on, and the voltage V1 or V1" at the node ND1 in the voltage storing unit 10 is output to the integration unit 20. Meanwhile, the voltage V1 or V1" is stored in the capacitor $C_1$ because the switching elements SW1, SW4 and SW6 are turned on.

Figure 3:
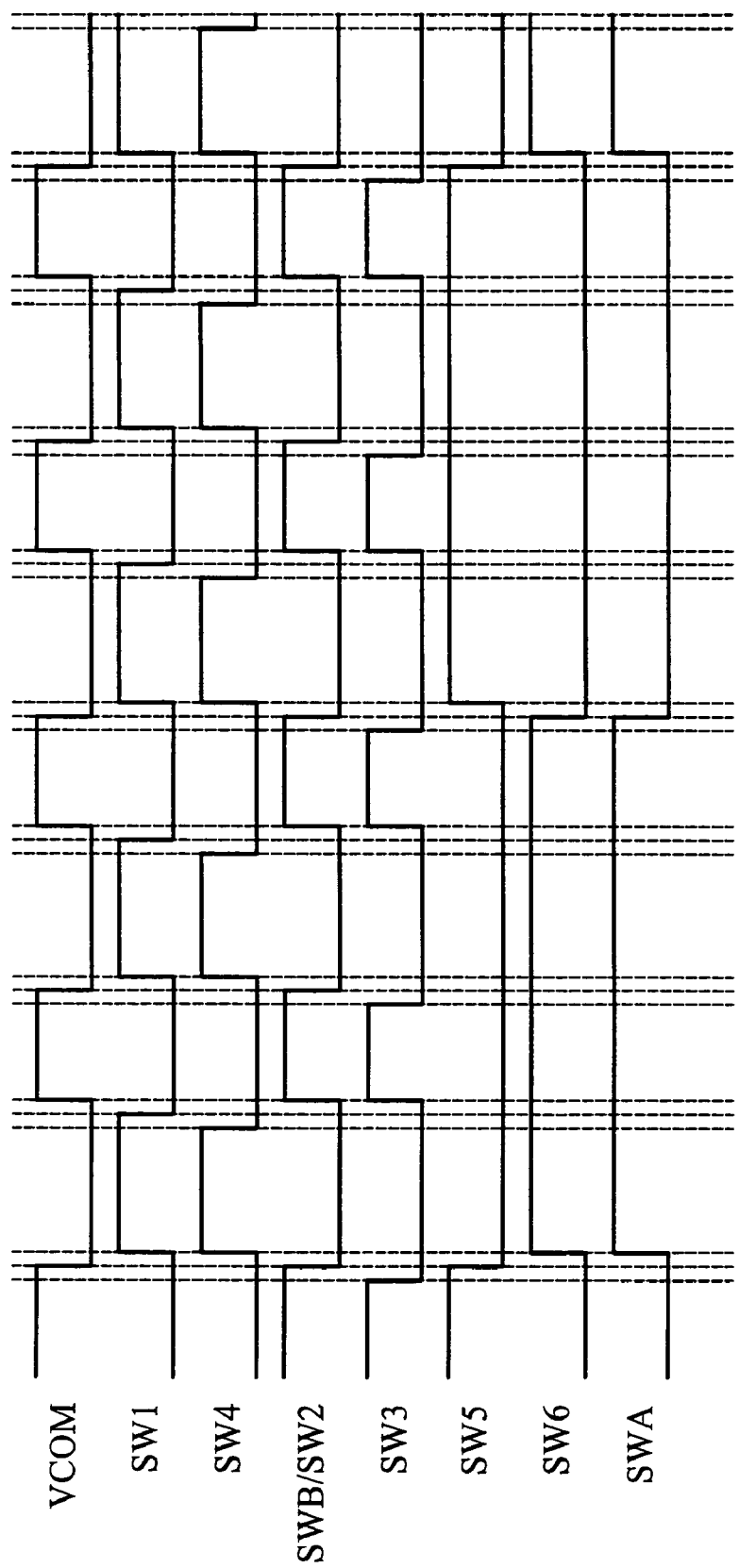
FIG. 3 is another timing chart of the touch sensing circuit shown in FIG. 1.

In this embodiment, the integration unit 20 performs integration once when the switching element SW6 is turned on, but is not limited thereto. In some embodiments, the integration unit 20 can perform integration several times when the switching element SW6 is turned on. FIG. 3 shows another timing chart of the touch sensing circuit as shown in FIG. 1. As shown in FIG. 3, the integration unit 20 performs integration two times when the switching element SW6 is turned on, and its operation is similar to that shown in FIG. 2, and thus is omitted for briefly.

Figure 4:
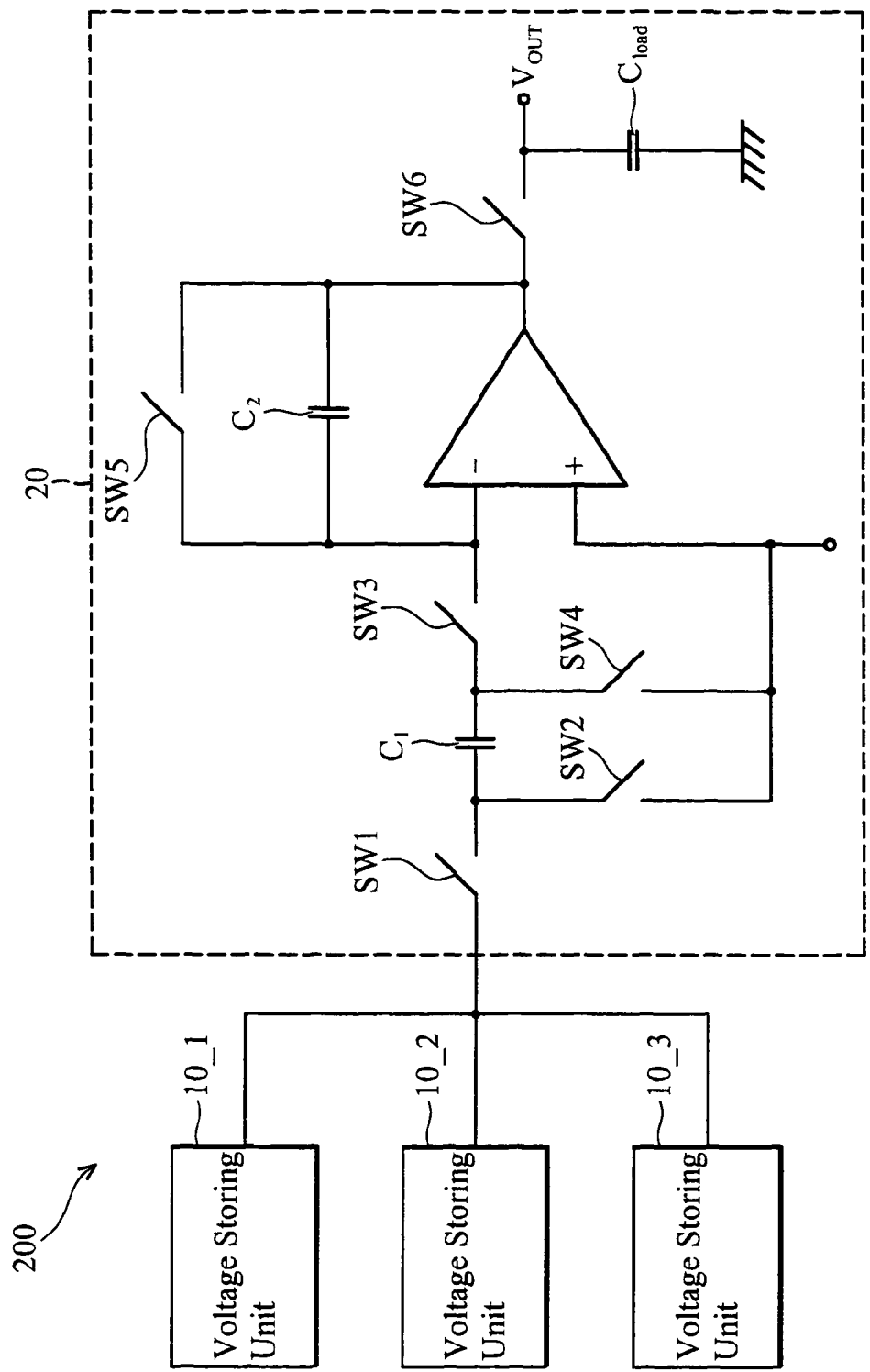
FIG. 4 shows another embodiment of a touch sensing circuit according to the invention.
Figure 5:
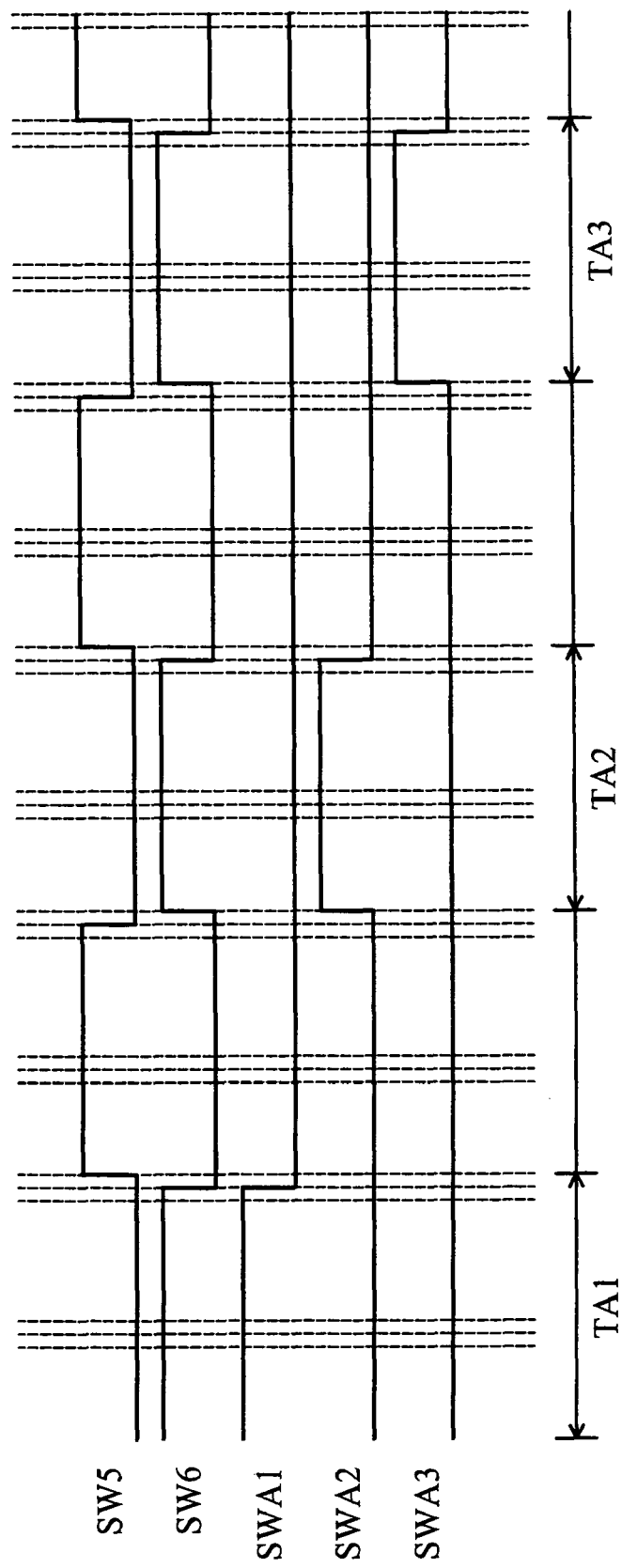
FIG. 5 is a timing chart of the touch sensing circuit shown in FIG. 4.

FIG. 4 shows another embodiment of a touch sensing circuit. As shown, the touch sensing circuit 200 is similar to the touch sensing circuit 100 shown in FIG. 1, differing only, in that the integration unit 20 is coupled to three voltage storing units 10_1~10_3, and the three voltage storing units 10_1~10_3 output the voltage at the node ND1 to the integration unit 20 at different times, thereby obtaining several output signals $V_{OUT}$ for touch processing. FIG. 5 is a timing chart of the touch sensing circuit shown in FIG. 4. As shown, the voltage storing units 10_1~10_3 output the voltage at the node ND1 therein to the integration unit 20 during periods TA1, TA2 and TA3 respectively, thereby obtaining several output signals $V_{OUT}$ for touch processing.

Figure 6:
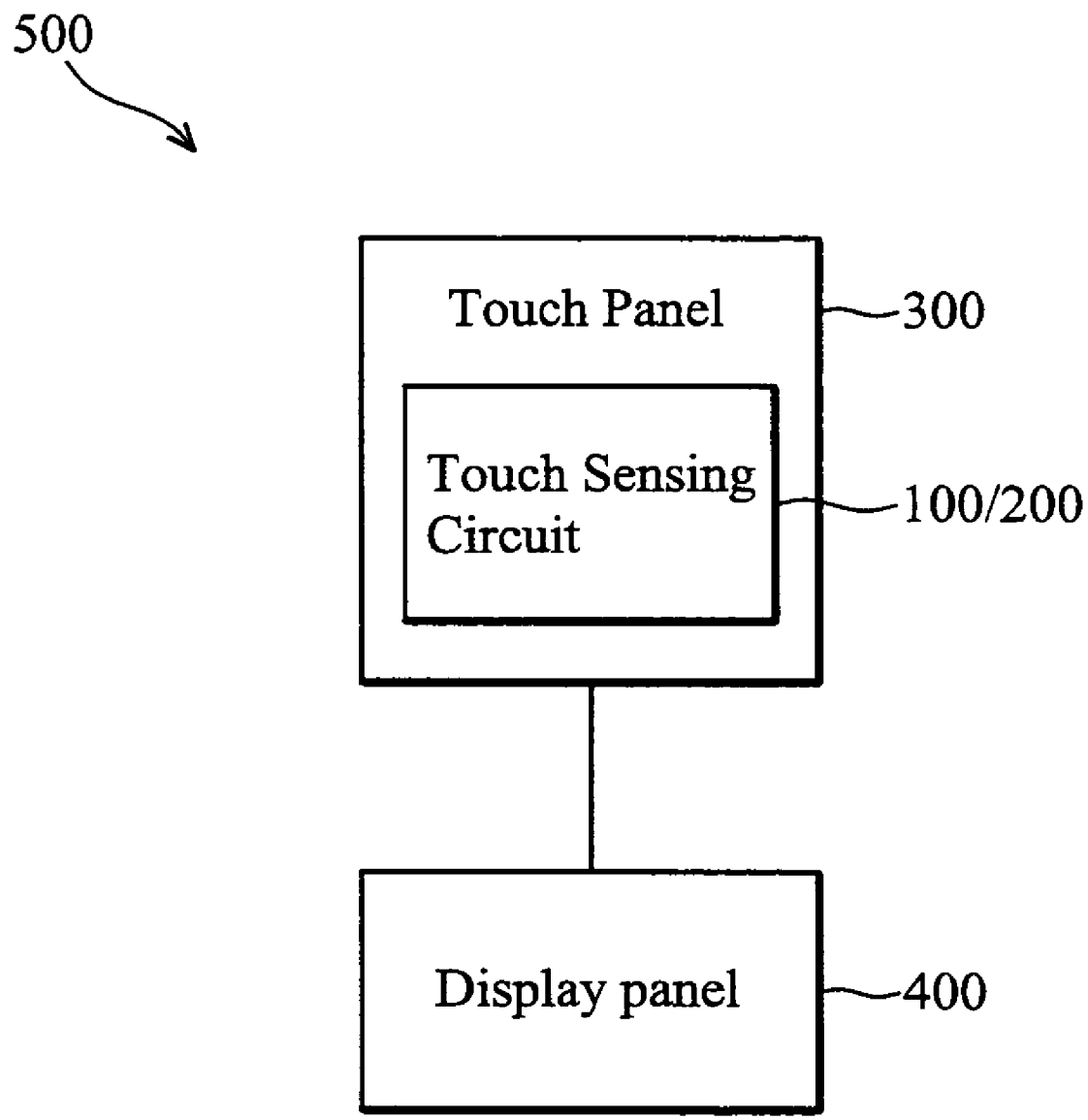
FIG. 6 shows another embodiment of an image display system according to the invention.

FIG. 6 shows an embodiment of an image display system which is implemented as an electronic device. As shown, the electronic device 500 comprises a touch panel 300 to interact with users and a display panel 400 to display images, in which the touch panel 300 comprises the touch sensing circuit 100 shown in FIG. 1 or the touch sensing circuit 200 shown in FIG. 4. The electronic device 500 can be, for example, a digital camera, a portable DVD, a television, a car display, a personal digital assistant (PDA), a display monitor, a notebook computer, a tablet PC or a mobile phone. The display panel 400 can be an organic light emitting display panel, a plasma display panel, a liquid crystal display or a TFT-driven display panel, but is not limited thereto. In some embodiments, the touch sensing circuit 100 or 200 can also be integrated into the display panel 400.

Although the invention has been described in terms of preferred embodiment, it is not limited thereto. Those skilled in the art can make various alterations and modifications without departing from the scope and spirit of the invention. Therefore, the scope of the invention shall be defined and protected by the following claims and their equivalents.

What is claimed is:

1. An image display system, comprising:
    a touch sensing circuit comprising at least one voltage storing unit to generate a corresponding voltage when a capacitance variation caused by a touch event occurs, wherein the voltage storing unit comprises:
    a first capacitor having a first terminal coupled to an alternating current (AC) common voltage from a common electrode and a second terminal coupled to a first node;
    a first switching element having a first terminal coupled to the second terminal of the first capacitor and a second terminal coupled to the AC common voltage; and
    a second switching element having a first terminal coupled to the second terminal of the first capacitor,
    wherein the touch sensing circuit further comprises an integration unit coupled to the second terminal of the second switching element to integrate the corresponding voltage thereby generating an output signal, and
    wherein the integration unit comprises:
    a third switching element having a first terminal coupled to the second terminal of the second switching element, and a second terminal;
    a second capacitor having a first terminal coupled to the second terminal of the third switching element, and a second terminal;
    a fourth switching element having a first terminal coupled to the second terminal of the third switching element, and a second terminal coupled to a low voltage level of the AC common voltage;
    a fifth switching element having a first terminal coupled to the second terminal of the second capacitor, and a second terminal;
    a sixth switching element having a first terminal coupled to the second terminal of the second capacitor, and a second terminal coupled to the low voltage level;
    an operational amplifier having an inversion input terminal coupled to the second terminal of the second capacitor, a non-inversion input terminal coupled to the low voltage level, and an output terminal;
    a third capacitor coupled between the inversion input terminal and the output terminal of the operational amplifier;
    a seventh switching element coupled between the inversion input terminal and the output terminal of the operational amplifier; and
    an eighth switching element coupled to the output terminal of the operational amplifier to output the output signal.

2. The image display system as claimed in claim 1, wherein the voltage storing unit further comprises a second capacitor coupled between a ground terminal and the second terminal of the first capacitor.

3. The image display system as claimed in claim 1, wherein the first switching element is turned on and the AC common voltage is changed to a high voltage level from a low voltage level such that the first node is charged to the high voltage level, during a first period.

4. The image display system as claimed in claim 3, wherein, during a second period, the first switching element is turned off and the AC common voltage is changed to the low voltage level from the high voltage level, such that the first node is pulled low to a first voltage level when the touch event does not occur, and the first node is pulled low to a second voltage level higher than the first voltage level when the touch event occurs.

5. The image display system as claimed in claim 1, further comprising a touch panel, wherein the touch panel comprises the touch sensing circuit.

6. The image display system as claimed in claim 5, further comprising an electronic device, wherein the electronic device comprises a display panel displaying images and the touch panel interacting with users.

7. The image display system as claimed in claim 6, wherein the display panel is an organic light emitting display panel, a plasma display panel, a liquid crystal display or a TFT-driven display panel.

8. The image display system as claimed in claim 7, wherein the electronic device is a personal digital assistant, a display monitor, a notebook computer, a digital camera, a car display, a tablet PC or a mobile phone.

9. The image display system as claimed in claim 1, wherein the first terminal of the first switching element is directly coupled to the second terminal of the first capacitor and the second terminal of the first switching element is directly coupled to the AC common voltage.

10. The image display system as claimed in claim 1, wherein when the first switching element is turned on, the second terminal of the first capacitor is conductively coupled to the AC common voltage via the first switching element.

11. An image display system, comprising:
a touch sensing circuit comprising:
first and second voltage storing units each generating a corresponding voltage when a capacitance variation caused by a touch event occurs; and
an integration unit integrating the corresponding voltage generated by the first voltage storing unit to generate a first output signal during a first period, and integrating the corresponding voltage generated by the second voltage storing unit to generate a second output signal during a second period, wherein the first and second voltage storing units each comprises:
a first capacitor having a first terminal coupled to an alternating current (AC) common voltage from a common electrode, and a second terminal coupled to a first node;
a first switching element having a first terminal coupled to the second terminal of the first capacitor and a second terminal coupled to the AC common voltage; and
a second switching element having a first terminal coupled to the second terminal of the first capacitor,
wherein the integration unit comprises:
a third switching element having a first terminal coupled to the second terminal of the second switching element, and a second terminal;
a second capacitor having a first terminal coupled to the second terminal of the third switching element, and a second terminal;
a fourth switching element having a first terminal coupled to the second terminal of the third switching element, and a second terminal coupled to a low voltage level;
a fifth switching element having a first terminal coupled to the second terminal of the second capacitor, and a second terminal;
a sixth switching element having a first terminal coupled to the second terminal of the second capacitor, and a second terminal coupled to the low voltage level;

an operational amplifier having an inversion input terminal coupled to the second terminal of the second capacitor, a non-inversion input terminal coupled to the low voltage level, and an output terminal;
a third capacitor coupled between the inversion input terminal and the output terminal of the operational amplifier;
a seventh switching element coupled between the inversion input terminal and the output terminal of the operational amplifier; and
an eighth switching element coupled to the output terminal of the operational amplifier to output the first and second output signals.

12. The image display system as claimed in claim 11, wherein the first and second voltage storing units each further comprise a second capacitor coupled between a ground terminal and the second terminal of the first capacitor.

13. The image display system as claimed in claim 12, wherein the first switching element is turned on and the AC common voltage is changed to a high voltage level from a low voltage level such that the first node is charged to the high voltage level, during a third period.

14. The image display system as claimed in claim 13, wherein, during a fourth period, the first switching element is turned off and the AC common voltage is changed to the low voltage level from the high voltage level, such that the first node is pulled low to a first voltage level when the touch event does not occur, and the first node is pulled low to a second voltage level higher than the first voltage level when the touch event occurs.

15. The image display system as claimed in claim 11, wherein, wherein the first terminal of the first switching element is directly coupled to the second terminal of the first capacitor and the second terminal of the first switching element is directly coupled to the AC common voltage.

16. The image display system as claimed in claim 11, wherein when the first switching element is turned on, the second terminal of the first capacitor is conductively coupled to the AC common voltage via the first switching element.

* * * * *